US012532393B2

(12) United States Patent
Wu et al.

(10) Patent No.: US 12,532,393 B2
(45) Date of Patent: Jan. 20, 2026

(54) COLOR TEMPERATURE CONTROL CIRCUIT

(71) Applicants: Jiangmen Jianghai Hecheng Lighting Co., Ltd, Jiangmen (CN); TAISHAN SIGMA ELECTRIC PRODUCTS CO., LTD, Taishan (CN)

(72) Inventors: Daofang Wu, Jiangmen (CN); Cheng-Ming Yen, Jiangmen (CN); Daowei Wu, Jiangmen (CN)

(73) Assignees: Jiangmen Jianghai Hecheng Lighting Co., Ltd, Jiangmen (CN); TAISHAN SIGMA ELECTRIC PRODUCTS CO., LTD, Taishan (CN)

( * ) Notice: Subject to any disclaimer, the term of this patent is extended or adjusted under 35 U.S.C. 154(b) by 103 days.

(21) Appl. No.: 18/395,988

(22) Filed: Dec. 26, 2023

(65) Prior Publication Data
US 2025/0193978 A1 Jun. 12, 2025

(30) Foreign Application Priority Data
Dec. 7, 2023 (CN) .......................... 202323328356.1

(51) Int. Cl.
*H05B 45/20* (2020.01)
(52) U.S. Cl.
CPC .................. *H05B 45/20* (2020.01)

(58) Field of Classification Search
None
See application file for complete search history.

(56) References Cited

U.S. PATENT DOCUMENTS 10,772,175 B1* 9/2020 Liu .................... H05B 45/3577
2015/0373790 A1* 12/2015 Boswinkel ............. H05B 47/19
315/186
2022/0174798 A1* 6/2022 Li ........................ H05B 45/50

* cited by examiner

*Primary Examiner* — Kenneth B Wells
(74) *Attorney, Agent, or Firm* — Birchwood IP

(57) ABSTRACT

The present disclosure is directed to a color temperature control circuit, including a signal input circuit, a main control chip U1, and a color temperature adjustment circuit. The color temperature adjustment circuit includes an optocoupler OP1, a first adjustment circuit, and a second adjustment circuit. The first adjustment circuit includes a field-effect transistor Q1 and a first light-emitting bead group; the second adjustment circuit includes a field-effect transistor Q2 and a second light-emitting bead group; color temperatures of the first and second light-emitting bead groups are different, a drain electrode of the field-effect transistor Q1 is connected to a gate electrode of the field-effect transistor Q2 through a diode D2. The main control chip U1 receives an input control signal, then outputs a signal to the optocoupler OP1, and controls a conduction of the field-effect transistors Q1 and Q2 through a high level and a low level, respectively.

5 Claims, 2 Drawing Sheets

COLOR TEMPERATURE CONTROL CIRCUIT

CROSS-REFERENCE TO RELATED APPLICATIONS

This application claims priority to Chinese Patent Application No. 202323328356.1, filed on Dec. 7, 2023, which is hereby incorporated by reference in its entirety.

TECHNICAL FIELD

The present disclosure relates to the field of luminaire technologies, and in particular, to a color temperature control circuit.

BACKGROUND

The color temperature adjustment of LEDs is mostly achieved by changing a proportion of light with different color temperatures. Increasing the low color temperature will warm the color temperature, while increasing the high color temperature will cool the color temperature. Generally speaking, two or more LED bead strings with significant color temperature differences are used in typical color and dimming circuits to form an operating circuit, such as 2700K and 6500K. The two LED bead strings are controlled separately through two independent outputs, and the brightness of the two LED bead strings is adjusted by current control so as to mix different color temperatures in the lamp body, thus achieving a design purpose of color temperature adjustment. However, a control cost of two optocouplers is relatively higher, so a color temperature control circuit is needed to achieve the design purpose of color temperature adjustment by simultaneously controlling multiple light bead strings through a single optocoupler control circuit.

SUMMARY

The main purpose of the present disclosure is to provide a color temperature control circuit that achieves a design purpose of color temperature adjustment by simultaneously controlling multiple light bead strings through a single optocoupler control circuit.

The present disclosure proposes a color temperature control circuit, which includes a signal input circuit, a main control chip U1, an optocoupler OP1, and a color temperature adjustment circuit; a control signal inputted by the signal input circuit is recognized by the main control chip U1 and a color temperature is controlled by the color temperature adjustment circuit;

the color temperature adjustment circuit includes the optocoupler OP1, a first adjustment circuit, and a second adjustment circuit; the first adjustment circuit includes a field-effect transistor Q1 and a first light-emitting bead group; the second adjustment circuit includes a field-effect transistor Q2 and a second light-emitting bead group; color temperatures of the first and second light-emitting bead groups are different; a drain electrode of the field-effect transistor Q1 is connected to a gate electrode of the field-effect transistor Q2 through a diode D2;

a signal is outputted to the optocoupler OP1 by the main control chip U1 and the field-effect transistors Q1 and Q2 are controlled through a high level and a low level, respectively; and thus, power and operating status of corresponding first and second light-emitting bead groups are controlled, thereby mixing them into a required color temperature.

In an embodiment of the present disclosure, the color temperature control circuit further includes a dimming driving circuit, and total power is controlled by the dimming driving circuit.

In an embodiment of the present disclosure, the color temperature control circuit further includes a power supply circuit, which is respectively connected and powered with the signal input circuit, the main control chip U1, and the color temperature adjustment circuit.

In an embodiment of the present disclosure, the first adjustment circuit further includes a resistor RZ2, a resistor RG1, a capacitor C4, and a voltage stabilizing diode ZD2.

In an embodiment of the present disclosure, the second adjustment circuit further includes a resistor RZ3, a resistor RG2, a capacitor C5, and a voltage stabilizing diode ZD3.

The beneficial effects of the color temperature control circuit of the present disclosure are:

1. a design purpose of the color temperature adjustment can be achieved by simultaneously controlling multiple light bead strings through a single optocoupler, thereby reducing costs.

2. by providing with the dimming drive circuit, power can be controlled.

Numeral reference: 1. external signal input circuit, 2. color temperature adjustment circuit, 3. dimming drive circuit, 4. power supply circuit, 5. internal signal input circuit, 6. rectification circuit, 21. first light-emitting bead group, 22. second light-emitting bead group.

The implementation, functional characteristics, and advantages of the present disclosure will be further explained in combination with the embodiments, with reference to the drawings.

DESCRIPTION OF EMBODIMENTS

It should be understood that the specific embodiments described here are only intended to explain the present disclosure and are not intended to limit the present disclosure.

Figure 1:
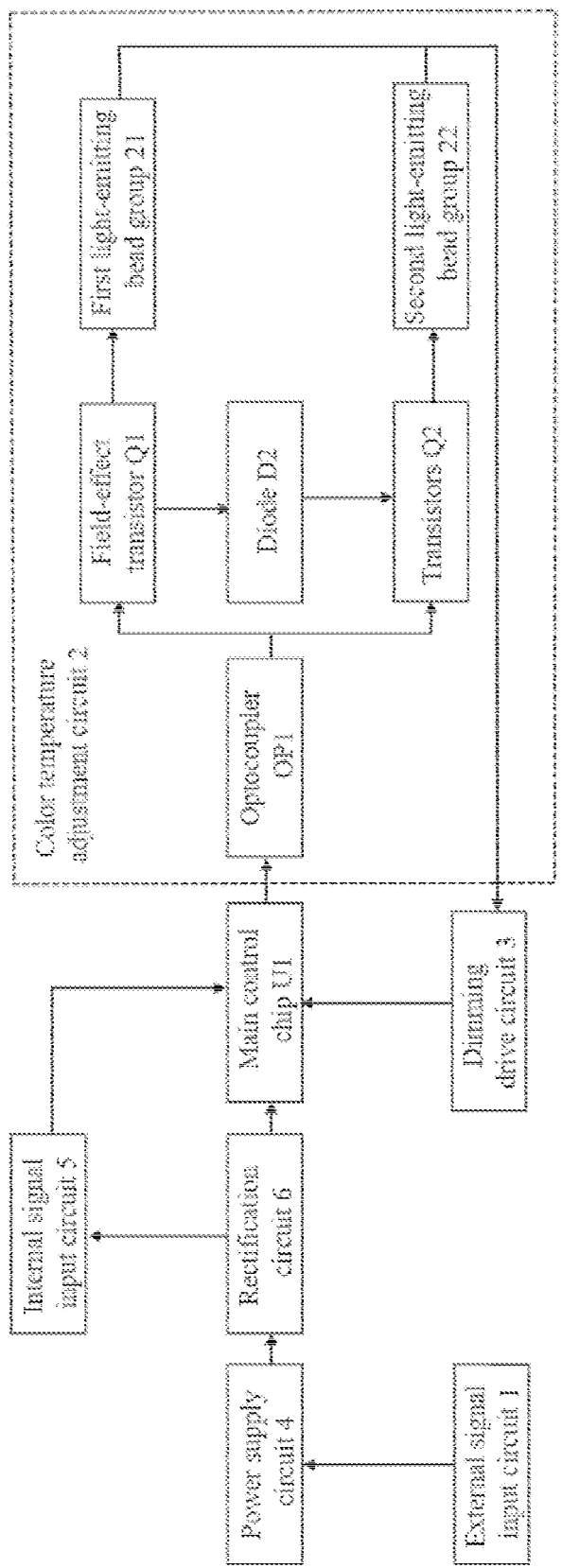
FIG. 1 is a flowchart of a color temperature control circuit of the present disclosure.
Figure 2:
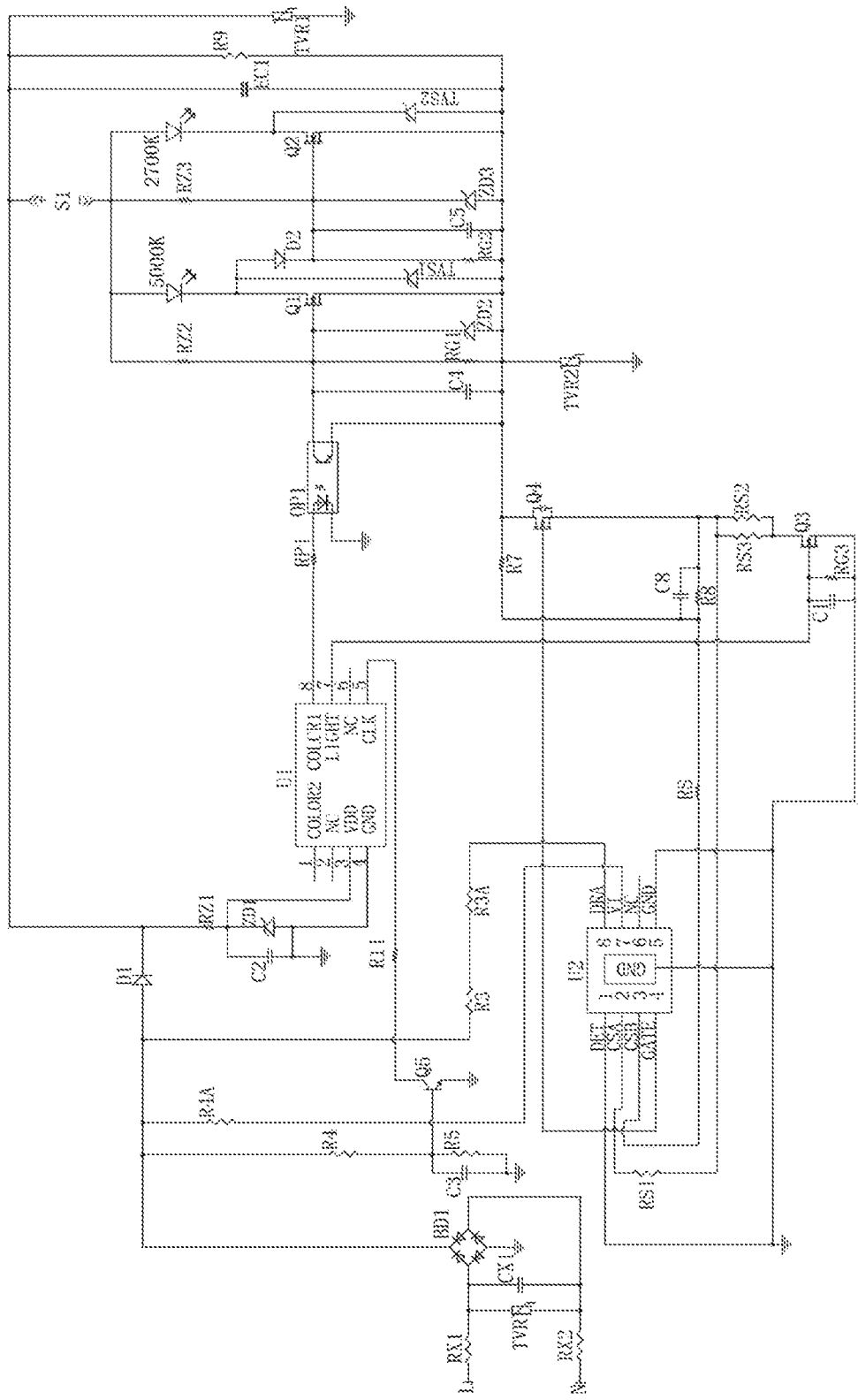
FIG. 2 is a circuit diagram of the color temperature control circuit of the present disclosure.

Referring to FIGS. 1 and 2, an embodiment of the color temperature control circuit of the present disclosure is proposed.

A color temperature control circuit includes a power supply circuit 4, an external signal input circuit 1, a dimming drive circuit 3, a main control chip U1, a color temperature adjustment circuit 2, an internal signal input circuit 5, and a rectification circuit 6.

The signal input circuit can be the internal signal input circuit 5 within a module, which obtains an external control signal through a wireless sensor and inputs it to the main control chip U1. The signal input circuit can also be the external signal input circuit 1 inside a front-end module. A sensor or input line in the front-end module obtains the external control signal and modulates it to an AC power input to output it to the color temperature control circuit. The control signal is collected and recognized by the main control chip U1.

After connecting the power supply circuit 4 and the rectification circuit 6, they are connected to the main control chip U1. The main control chip U1 is respectively connected to the color temperature adjustment circuit 2, the internal signal input circuit, and the color temperature adjustment circuit 2.

The color temperature adjustment circuit 2 includes an optocoupler OP1, a first adjustment circuit, and a second adjustment circuit. The first adjustment circuit includes a field-effect transistor Q1, a first light-emitting bead group 21, a resistor RZ2, a resistor RG1, a capacitor C4, and a voltage stabilizing diode ZD2. The second adjustment circuit includes a field-effect transistor Q2, a second light-emitting bead group 22, a resistor RZ3, a resistor RG2, a capacitor C5, and a voltage stabilizing diode ZD3.

One side of an output end of the optocoupler OP1 is connected to a gate electrode of the field-effect transistor Q1 in the first adjustment circuit. A drain electrode of the field-effect transistor Q1 is connected to the first light-emitting bead group 21 and one end of the diode D2, respectively. The other end of the diode D2 is connected to the gate electrode of the field-effect transistor Q2, and the drain electrode of the field-effect transistor Q2 is connected to the second light-emitting bead group 22.

In this embodiment, a color temperature of the beads in the first light-emitting bead group 21 is 5000K, and a color temperature of the beads in the second light-emitting bead group 22 is 2700K. The light-emitting beads in the first light-emitting bead group 21 and the second light-emitting bead group 22 are connected in series and parallel.

The dimming drive circuit 3 includes a dimming drive chip U2, an overall output power is controlled by the dimming drive chip U2.

When in use, the main control chip U1 receives a control signal output from the signal input circuit 1, and outputs a control signal based on a preset control value and outputs it to the first and second adjustment circuits through the optocoupler OP1. The high level drives a conduction of the field-effect transistor Q1, and the low level drives a conduction of the field-effect transistor Q2, thereby controlling power and operating status of corresponding first and second light-emitting bead groups 21 and 22 and mixing them into a required color temperature.

The above is only a preferred embodiment of the present disclosure and does not limit the scope of the present disclosure. Any equivalent structural changes made using the description and drawings of the present disclosure, or directly or indirectly applied in other related technical fields, are equally included in the protection scope of the present disclosure.

What is claimed is:

1. A color temperature control circuit, comprising:
a power supply circuit, an external signal input circuit, a dimming drive circuit, a main control chip, an optocoupler, a color temperature adjustment circuit, an internal signal input circuit, and a rectification circuit; wherein a control signal output from the signal input circuit is received by the main control chip, and a color temperature is controlled by the color temperature adjustment circuit;

after connecting the power supply circuit and the rectification circuit, the power supply circuit and the rectification circuit are connected to the main control chip; the main control chip is connected to the color temperature adjustment circuit, the internal signal input circuit, and the color temperature adjustment circuit;

the color temperature adjustment circuit comprises the optocoupler, a first adjustment circuit, and a second adjustment circuit; the first adjustment circuit comprises a first field-effect transistor and a first light-emitting bead group; the second adjustment circuit comprises a second field-effect transistor and a second light-emitting bead group; color temperatures of the first and second light-emitting bead groups are different; a drain electrode of the first field-effect transistor is connected to a gate electrode of the second field-effect transistor through a diode;

the internal signal input circuit obtains a control signal through a wireless sensor and outputs the control signal to the main control chip, and the control signal is output to the optocoupler by the main control chip, and the first and second field-effect transistors are controlled through a high level and a low level, respectively; and thus, power and operating status of corresponding first and second light-emitting bead groups are controlled, thereby mixing them into a required color temperature; wherein the high level drives a conduction of the first field-effect transistor, and the low level drives a conduction of the second field-effect transistor.

2. The color temperature control circuit according to claim 1, further comprising a dimming drive circuit, wherein total power is controlled by the dimming driving circuit.

3. The color temperature control circuit according to claim 1, further comprising a power supply circuit, which is respectively connected to and powered with the signal input circuit, the main control chip, and the color temperature adjustment circuit.

4. The color temperature control circuit according to claim 1, wherein the first adjustment circuit further comprises a first resistor, a second resistor, a first capacitor, and a first voltage stabilizing diode.

5. The color temperature control circuit according to claim 1, wherein the second adjustment circuit further comprises a third resistor, a fourth resistor, a second capacitor, and a second voltage stabilizing diode.

* * * * *